United States Patent [19]

Gillery et al.

[11] 4,094,763

[45] June 13, 1978

[54] SPUTTER COATING OF GLASS WITH AN OXIDE OF A METAL HAVING AN ATOMIC NUMBER BETWEEN 48 AND 51 AND MIXTURES THEREOF

[75] Inventors: Frank H. Gillery, Allison Park; Jean P. Pressau, Evans City; Robert E. Kubichan, Tarentum, all of Pa.

[73] Assignee: PPG Industries, Inc., Pittsburgh, Pa.

[21] Appl. No.: 435,788

[22] Filed: Jan. 23, 1974

Related U.S. Application Data

[60] Division of Ser. No. 241,858, Apr. 6, 1972, which is a continuation of Ser. No. 60,002, Jul. 31, 1970, abandoned.

[51] Int. Cl.² .............................................. C23C 15/00
[52] U.S. Cl. .................................................. 204/192 P
[58] Field of Search ................................. 204/192, 298

[56] References Cited

U.S. PATENT DOCUMENTS

| 3,414,503 | 12/1968 | Brichard | 204/298 |
| 3,451,912 | 6/1969 | D'Heurle et al. | 204/192 |
| 3,531,335 | 9/1970 | Heyerdahl et al. | 148/174 |
| 3,630,873 | 12/1971 | Moore et al. | 204/298 |
| 3,655,545 | 4/1972 | Gillery et al. | 204/192 |
| 3,907,660 | 9/1975 | Gillery | 204/192 |

FOREIGN PATENT DOCUMENTS

| 520,592 | 4/1940 | United Kingdom | 204/192 |
| 1,147,318 | 4/1969 | United Kingdom | 204/298 |

OTHER PUBLICATIONS

"Apparatus for the Controlled Deposition of Optical Film Systems" by Steckelmacher et al., Vacuum, Feb. 2, 1959, pp. 171–182.

"Deposition Measurements in a Cathode Sputtering System" by Schaible et al., IBM Technical Disclosure Bulletin, vol. 6, No. 1, Jun. 1963, pp. 112–113.

Primary Examiner—O. R. Vertiz
Assistant Examiner—Wayne A. Langel
Attorney, Agent, or Firm—E. Kears Pollock; Edward I. Mates

[57] ABSTRACT

Transparent, electroconductive articles produced by cathode sputtering on refractory substrates, a metal from the group of elements having an atomic number from 48 to 51 and mixtures thereof, and preferably a controlled proportion of tin to indium, in a low pressure atmosphere containing a controlled amount of oxygen at a controlled substrate temperature within a temperature range of 400° F. to a temperature at which the substrate becomes distorted or detrimentally affected, usually at or above 600° F.

11 Claims, 3 Drawing Figures

SPUTTER COATING OF GLASS WITH AN OXIDE OF A METAL HAVING AN ATOMIC NUMBER BETWEEN 48 AND 51 AND MIXTURES THEREOF

This is a division of application Ser. No. 241,858, filed Apr. 6, 1972, which is a continuation of application Ser. No. 60,002, filed July 31, 1970, now abandoned.

This invention relates to COATING GLASS and particularly relates to transparent, electroconductive articles produced by depositing a transparent conductive metal oxide film of a metal from the group of elements having an atomic number from 48 to 51 and mixtures thereof, on a transparent ceramic base using a vacuum process, such as vacuum evaporation or cathode sputtering, preferably the latter.

Prior to the present invention, others have attempted to apply conductive coatings by the vacuum evaporation of various metal oxides such as indium oxide. These techniques were developed as a lower temperature coating operation to replace the prior art pyrolization processes in which it was necessary to heat the substrate to a temperature at which it softens and distorts, and/or loses a temper previously imposed either thermally or chemically at these elevated temperatures.

In a pure oxygen atmosphere, vacuum evaporation must be done very slowly to insure that the metal combines with oxygen and to minimize decomposition which occurs. The films produced often have to be heated subsequently to the vacuum evaporation process to improve their electroconductivity.

Cathode sputtering has also been used to form oxide films of the aforesaid metals, particularly indium oxide films. Some of these previous methods of producing sputtered indium oxide films rely on the oxidation of the cathode and the sputtering of this oxide to produce the film. The rate of sputtering is limited by the rate of oxidation of the cathode. The cathode temperature cannot be raised to increase the rate of oxidation because indium melts at the very low temperature of about 315° F. Others have tried to increase the rate of cathode oxidation by using pure oxygen as a sputtering gas. This is inefficient because oxygen gives a low sputtering yield and because the stoichiometry of the finished film is difficult to control. Others have used sequential treatments in oxygen and argon, the former to oxidize the cathode and the latter to transfer the oxide from the cathode to the substrate. A multiple step process is inconvenient, time consuming, expensive and each added step increases the likelihood of losing control of the process.

Still another method of obtaining indium oxide films is described in U.S. Pat. No. 2,825,687 to Preston. In this patent, indium or other metal oxide is sputtered or the metal is sputtered in an atmosphere containing only a trace of oxygen to produce a colored or opaque film, and the film is subsequently heated in air to develop a permanent conductivity and improve film transmission. Again this process is inconvenient, time consuming and results in a high resistance film with inferior optical properties.

In an attempt to improve the optical transmission coefficient as well as the electroconductivity of the resulting film, it has been proposed in application Ser. No. 709,135 of Frank H. Gillery and Jean P. Pressau, filed Feb. 28, 1968, abandoned in favor of U.S. application Ser. No. 56,117, filed July 2, 1970, now U.S. Pat. No. 3,655,545, to cathode sputter in a low pressure atmosphere containing sufficient oxygen to assure the formation of a colorless film having adequate optical properties but insufficient electroconductivity, and then to heat the coated article in an oxygen-deficient atmosphere for sufficient time to increase the electroconductivity and to discontinue the heating before the film develops a color. This technique produces films having a better combination of optical and electrical properties than those of the hitherto prior art. However, this process involves either evacuation of oxygen from the low pressure atmosphere for the post-heating step or removal of the coated article to an evacuated environment for the post-heating step. Either alternative is time consuming.

Cathode sputtering causes a substrate to be heated. However, such heating is hard to regulate and non-uniform coating results. U.S. Pat. No. 3,369,989 to Kay, et al discloses apparatus for controlling the temperature of a substrate by providing substrate mounting means in the form of a hollow anode enclosing heating and cooling elements. The upper surface of the anode supports the substrate in surface to surface contact therewith and is alleged to be capable of controlling the substrate temperature at 300° C. within 1° C. throughout the extent of a small substrate. This patent implies that the substrate must be maintained at a constant temperature throughout the cathode sputtering operation. The time needed to heat the substrate to an equilibrium temperature before starting cathode sputtering increases the time necessary for a complete coating operation. In addition, if the substrate is glass, whose length and width are more than 6 inches, it is impossible to maintain the uniformity of contact needed to provide conductivity of sufficient uniformity (less than 20% variation in local conductivity throughout the substrate) to satisfy present commercial requirements.

SUMMARY OF THE INVENTION

It has now been discovered that it is not necessary to maintain the substrate at a constant temperature throughout the cathode sputtering operation provided the substrate is heated to a minimum temperature of about 400° F. before starting the cathode sputtering and the substrate temperature varies between 400° F. and a temperature below which the substrate becomes distorted or detrimentally affected during sputtering and the substrate is cooled to below the temperature at which cathode sputtering is started before removing the substrate from the low pressure atmosphere used for cathode sputtering. Frequently, the low pressure atmosphere is evacuated during the cooling that follows cathode sputtering.

According to a sophisticated version of the present invention, cathode sputtering is conducted in a low pressure atmosphere of oxygen and an inert gas, preferably argon, in which the oxygen content of the mixture is controlled within limits determined by the temperature developed in the substrate during the cathode sputtering operation. Exposed electroconductive heating wires coupled electrically to a low voltage source are used to heat the substrate by radiation rather than by convection or conduction by contact during the cathode sputtering. The heating wires are equally spaced from one another and are disposed in an area aligned with and extending beyond the area occupied by the substrate to insure a uniform blanket of radiant heat at the substrate.

This arrangement using radiant heat is superior to the prior art heat transfer by conduction by contact when an attempt is made to coat glass substrates whose length is more than 6 inches and whose width is more than 6 inches. This superiority from using radiant heat rather than conduction by contact with an anode to control temperature makes it possible to control the substrate temperature independently of the anode temperature, thus bringing better control to the coating operation.

In coating very large sheets, the cathode target has been made of an elongated construction having one dimension longer than one dimension of a substrate and providing means for reciprocating the cathode along an axis with a displacement greater than the other dimension of the substrate. U.S. Pat. No. 3,414,503 to Brichard shows such a device for coating substrates supported in a vertical plane. This patented apparatus is so arranged that it is impossible to heat a substrate independently of the heat it develops incidental to the sputtering process.

Apparatus conforming to one embodiment for performing the present invention has a series of vertically adjustable supports arranged in two sets of intersecting rows that provide spaced points of support for one or more flat or curved substrates as the case may be. The bottom substrate surface is supported on spaced points having minimum heat exchange relation at the points of support. Hence, the radiant heating means disposed to one side of the supported substrate or substrates is able to provide a uniform heating pattern over the entire bottom surface of the substrate so that it now becomes possible to maintain the substrate temperature approximately uniform even when a cathode is reciprocated in facing relation to the opposite surface of the substrate, since a sufficient portion of the heat input to the substrates treated to control the substrate temperature radiates from the exposed heating means and only a minor portion of the heat input results from the sputtering between the moving cathode and the upper surface of the substrate, particularly during the early stages of the process before the substrate attains an equilibuim temperature range.

The metal to be deposited by cathode sputtering may be any metal known to have cathode sputtering properties. However, excellent results are obtained using metals from the group having atomic numbers from 48 to 51 and mixtures thereof, particularly mixtures of metals having atomic numbers that differ by one. Superior properties result from films produced by sputtering from a cathode having a target surface composed of a mixture of indium and tin containing between 1 and 20% by weight of tin and the balance indium.

The maximum temperature to which the substrate or substrates are subjected during sputtering depends on the size and nature of the substrate. For example, thicker glass sheeets as thick as ½ inch may be heated to as high as 800° F. without distortion, whereas sheets as thin as 0.007 inch maintain good optical shape without distortion at 600° F. for time sufficient to produce highly transparent, highly electroconductive films. Chemically tempered glass sheets are heated only to a maximum temperature of approximately 500° F. during cathode sputtering to avoid any deleterious effects on the temper imposed chemically. These temperatures are below those required for forming transparent electroconductive films by pyrolysis of a metal salt composition.

The atmosphere in which cathode sputtering takes place is preferably at a pressure less than $10^{-1}$ torr. The atmosphere is carefully controlled by introducing a metered amount of oxygen and inert gas (preferably argon) to replace the gas removed by a vacuum pump.

The electroconductivity of the film is monitored as the film forms and the substrate is heated by an independent heater to within a few degrees of a predetermined temperature, preferably above 500° F. The coated article is retained in the sputtering atmosphere after sputtering is stopped and cooled before exposure to air. In cases where the value of electrical resistivity is not important, this cooling can be minimal. However, in case the final resistance desired is a minimum, it is desirable to evacuate the sputtering atmosphere and cool the coated article to below the initial cathode sputtering temperature and, even more preferably, to below 300° F., before removing the article from the atmosphere and exposing the coated article to air. Post-heating treatment needed in prior art techniques to obtain a lower resistance for the film so formed or to improve its luminous transmittance may be dispensed with provided the substrate temperature is controlled as taught by the present invention.

According to a more sophisticated operation, the partial pressure of oxygen in the low pressure atmosphere of the sputtering chamber is initially relatively high as the cathode sputtering begins and is reduced as the temperature of the substrate is increased during the cathode sputtering process.performed simultaneously with independent heating.

This sophisticated version of the present invention involves initially providing an excess of oxygen over the partial pressure needed to balance the amount of metal being sputtered during the initial phase of cathode sputtering after the substrate temperature reaches a minimum of 400° F. due to the application of heat from an external heat source. As the temperature of the substrate increases above the initial temperature at which cathode sputtering begins, the partial pressure of oxygen is reduced in the mixture added to replace the gases that are evacuated. The aforesaid technique develops a clear film that does not require post-heating in air as is necessary with earlier techniques in which only a trace of oxygen is used during the sputtering in the low pressure atmosphere. Furthermore, the conductivity of the resulting coatings as well as the transparency, are superior to those resulting from prior art techniques involving the initial application of cathode sputtering in an atmosphere that has an excess of oxygen followed by post heating in a reducing atmosphere.

A still further improvement provided by the present invention that results in a more uniform deposition of coating is the use of a scanning cathode that reciprocates in uniformly spaced relation to the glass surface to be coated during the cathode sputtering operation. The reciprocation of the cathode with respect to the sheet causes each increment of the glass sheet that is sputtered as the chathode reciprocates in spaced relation to the substrate to be coated in small increments. This provides greater overall uniformity of coating for the substrate than a cathode sputtering operation using a large cathode of substantially the same size as the large glass sheet to be coated (for example, in excess of 6 inches for each dimension), because plasma emanating from a large cathode tends to concentrate in the central portion of the cathode and this concentration results in a similar concentration of coating on the substrate surface.

Another factor in promoting more uniformity of coating is the use of a frame of glass or other material surrounding the article to be coated. This avoids edge effects.

There are many parameters that determine the film forming rate and the nature of the film formed. The present invention has made possible the selection of the more important parameters that determine certain film characteristics during the cathode sputtering operation to obtain suitable repeatability of optical and electrical characteristics from article to article. In other words, the present invention provides a technique wherein a glass sheet is inserted into a vacuum coating chamber for coating and its processing is completed to form a coated article having the requisite optical and electroconductive characteristics before the article is removed from the vacuum coating chamber.

The present invention uses as its environment an apparatus having a predetermined size of vacuum chamber, voltage source, target composition and size, and target to substrate spacing, and, in cases where large glass sheets (whose length and width exceed 12 inches) are coated, means to reciprocate the target relative to the substrate at a certain speed of reciprocation. While these parameters can be changed and can differ from pattern to pattern, once these parameters are established, the temperature of the substrate and the partial pressure of oxygen in the low pressure atmosphere are kept in balance to obtain optimum quality films. Generally, the electroconductivity of a film produced at a higher substrate temperature during cathode sputtering is more permanent than that of a film produced at a lower substrate temperature, but a practical maximum temperature is one that is below the deformation temperature of the substrate. The composition of metal used for the cathode, particularly in the case of indium-tin cathodes, for example, the ratio of tin to indium, is a factor in the electroconductivity of the film formed. Films from pure indium cathodes are less electroconductive than those produced using a small proportion of tin and have less stable electroconductivities. Typically, indium cathodes having 1% to 20% by weight of tin yield highly conductive films.

The following experiments to coat 4 inch square substrates of soda-lime-silica glass disclose more precisely the effect of the various parameters on the conductivity, its durability of conductivity, film forming rate and other factors.

For all the experiments using glass sheets as substrates, the glass is cleaned with a mixture of 50% n-propanol in water. If the glass has a surface stain or other surface defect, mild blocking with cerium oxide is advised. Otherwise, the cleaning with the water-n-propanol mixture is sufficient.

After cleaning, the glass is placed in position in the chamber and the pumpdown is started. This continues until the pressure reaches $10^{-4}$ torr or below. Argon gas is admitted to the chamber to maintain this pressure and flush the system for several minutes.

When the system has been purged of the greater part of its residual gas, a mixture of argon and oxygen (0.5 to 15% oxygen) is admitted while still pumping until the pressure is between 5 and 50 millitorr. To conserve gas, the pumping speed is decreased during coating by an adjustable baffle.

A gradually increasing voltage is slowly applied from a high voltage source (preferably 5000 volts D.C. or more) to the cathode and a glow discharge starts. Rapid application of high voltage often causes arcing and the possibility of damage to the power supply.

During pumpdown and voltage application, the substrate is being raised in temperature by electrical resistance wire heaters disposed in parallel relation, for example, at 1 inch spacing and 2 inches from the opposite surface of the substrate from that coated. According to the present invention, coating is not begun until the substrate is heated to a temperature of 400° F.

During coating, the resistance of the deposited film is monitored continually. The oxygen concentration is varied to maintain a controlled rate of resistance decrease. If this is not done, the presence of too much oxygen can cause too slow a rate of decrease of resistance or even an increase in resistance. Too little oxygen can produce an opaque metallic film.

The amount of oxygen required in the gas mixture varies with many other system parameters as follows:

1. The amount of residual oxygen in the system.
2. The amount of water vapor in the system. The water vapor decomposes under the influence of the glow discharge. The hydrogen ions carry current in the system but are ineffective in sputtering because of their low mass. The oxygen ions produced by dissociation of water molecules in the system cause oxidation of the film. Even if the system is pumped or flushed with argon for many hours before coating, the glow discharge can still release adsorbed water vapor from the surfaces in the system.
3. The temperature of the substrate, which controls the rate of reaction of indium or other metal with oxygen and also the metal-oxygen equilibrium.
4. The rate of deposition. To a certain extent the rate of arrival of indium on the substrate has to be balanced against the rate of bombardment by oxygen.

The ionized gas atoms, in this case argon and oxygen ions, are attracted to the cathode by the applied potential. An exchange of momentum takes place as the ions penetrate the target. Atoms of the target material are ejected and also electrons. Both travel away from the cathode, the charged electrons gaining energy because of the electric field. At some point (the limit of the cathode dark space) the electrons have gained sufficient energy to ionize additional gas atoms and the process is repeated. The metal atoms continue and are eventually deposited onto the substrate.

The momentum exchange process taking place at the cathode is most effective with heavy ions such as argon. Argon is chosen for most sputtering processes because of its low cost and high mass. Xenon and krypton would produce more efficient sputtering but are expensive for general use.

The oxygen is present to produce metal oxide rather than metal films. The metal oxide films are transparent whereas the metal films are not. In this particular system the oxidation appears to take place on the substrate, since it is greatly affected by substrate temperature. Under different conditions, oxidation of the cathode and oxide sputtering may take place at a slower sputtering rate not desired for commercial operations.

EXAMPLE I

In a first series of experiments coating glass sheets 4 inches square using a cathode of 94.4% indium and 5.6% tin by weight, a cathode-substrate distance of 2 inches, a total gas pressure of 20 millitorr, a substrate temperature of 610° F. provided in part by heating wires energized at 25 volts A. C. during cathode sputtering for 15 minutes at a voltage of 2000 volts and a glow discharge current of 180 milliamperes, in argon atmospheres containing different oxygen concentrations, the following results occur:

| OXYGEN CONCENTRATION | FILM THICKNESS (A) | RESISTANCE OHMS/SQUARE | RESISTIVITY OHM - CMS. |
|---|---|---|---|
| 6.3% | 1410 | 150 | $1.96 \times 10^{-3}$ |
| 3.2% | 1700 | 92 | $1.55 \times 10^{-3}$ |
| 1.6% | 2260 | 56 | $1.12 \times 10^{-3}$ |
| 1.35% | 2700 | 36 | $0.921 \times 10^{-3}$ |
| 1.01% | 3400 | 29 | $0.985 \times 10^{-3}$ |
| 0.7% | Metallic Indium Film | | |

Within the limits of measurement, the above results show the following:

1. The sputtering rate is greater at lower oxygen concentrations.
2. The specific resistivity generally decreases at lower oxygen concentrations.
3. The lower limit of oxygen concentration suitable for cathode sputtering is reached when metallic indium rather than indium oxide is produced.

EXAMPLE II

The following samples are coated under conditions similar to those used in Example I except that the substrate temperature and oxygen concentration is varied to produce the following results.

| SUBSTRATE TEMPERATURE | OXYGEN CONCENTRATION | RESISTIVITY (OHMS/SQUARE) |
|---|---|---|
| 400° F. | 1.0% | 93 |
| 610° F. | 1.0% | 29 |
| 800° F. | 1.0% | 17 |
| 400° F. | 1.35% | 75 |
| 610° F. | 1.35% | 36 |
| 800° F. | 1.35% | 19 |
| 400° F. | 1.6% | 176 |
| 610° F. | 1.6% | 56 |
| 800° F. | 1.6% | 14 |
| 400° F. | 3.2% | 910 |
| 400° F. | 3.2% | 670 |
| 610° F. | 3.2% | 92 |
| 800° F. | 3.2% | 50 |
| 400° F. | 6.3% | 590 |
| 610° F. | 6.3% | 150 |
| 800° F. | 6.3% | 121 |

The above example indicates that the temperature of the substrate while the film is being deposited is important. The higher temperatures give the best results but in this work the highest temperature investigated was 800° F. since much higher temperatures than this will affect the soda-lime glass substrates used as samples. At temperatures lower than 400° F., the oxygen pressure required to produce conductive films becomes so critical that metallic indium films are often inadvertently produced. At the lower temperatures also the rate of reaction of indium atoms with oxygen atoms on the substrate becomes controlling and the rate of deposition of indium may have to be decreased.

Further experiments were performed using cathodes of different compositions and maintaining the substrate at the indicated substrate temperature for each experiment. The controls and results obtained are enumerated in Examples III, IV and V for different cathodes.

EXAMPLE III

Using a cathode composed of 9% tin and 91% indium by weight, a cathode to substrate distance of 2 inches, a total gas pressure of 23 millitorr, maintaining a substrate temperature at 550° F, a voltage of 3000 volts and a current of 555 milliamperes during 8 minutes of cathode sputtering produced the following film thicknesses having the resistances per unit square recorded in the following table for various samples coating in argon-oxygen mixtures having the recorded oxygen concentration added by volume.

| RESULTS FROM 9% TIN - 91% INDIUM CATHODE | | | |
|---|---|---|---|
| Oxygen Concentration | Film Thickness Angstroms | OHMS Per Square | Remarks |
| 10% | 1098 | 100 | Clear film |
| 9% | 1298 | 110 | Clear film |
| 8% | 1310 | 110 | Clear film |
| 7% | 1069 | 110 | Clear film |
| 6% | 1472 | 80 | Clear film |
| 5% | 1619 | 65 | Clear film |
| 4% | 1855 | 65 | Clear film |
| 3% | 1885 | 50 | Clear film |
| 2% | 2356 | 25 | Clear film |
| 1% | | 25 | Cloudy film |
| 1% | | 50 | Gray film |
| 1% | | 60 | Cloudy film |
| 1% | | 20 | Cloudy film |

EXAMPLE IV

A setup similar to Example III was used except that the cathode was pure indium, the total gas pressure was 29 millitorr, the substrate temperature was 600° F, the cathode to substrate distance was 2 inches and a voltage of 3000 volts was impressed for 10 minutes to produce a current of 500 milliamperes during cathode sputtering under various concentrations of oxygen.

| RESULTS FROM PURE INDIUM CATHODE | | | |
|---|---|---|---|
| OXYGEN CONCENTRATION | FILM THICKNESS ANGSTROMS | OHMS PER SQUARE | REMARKS |
| 6.3% | 1280 | 550 | Clear film |
| 3.2% | 1640 | 330 | Clear film |
| 1.6% | 1799 | 350 | Clear film |
| 1.4% | 1650 | 280 | Clear film |
| 1.0% | 2067 | 350 | Clear film |

EXAMPLE V

The following experiments were performed using a cathode composed of 7.5% antimony and 92.5% tin by weight at a cathode-substrate distance of 2 inches, a voltage of 3000 1 volts impressing a current of 600 milliamperes for 15 minutes in various argon-oxygen systems containing different oxygen concentration at a pressure of 33 millitorr. The results are recorded below:

| RESULTS FROM 7.5% ANTIMONY - 92.5% TIN CATHODE | | |
|---|---|---|
| OXYGEN CONCENTRATION | OHMS PER SQUARE | REMARKS |
| 10% | 700 | Clear film |
| 5% | 250 | Clear film |
| 2% | 100 | Clear film |

The concentration of tin in the indium cathode may range from 1 to 20% and has an optimum at around 10 - 15%. If no tin is added, the lowest resistance films cannot be made even though fairly high conductivity can be obtained from oxygen variances produced by low oxygen pressure. The films so made with pure indium cathodes are prone to change resistance on heating at temperatures above about 150° F., whereas films produced from indium cathodes containing 10% tin have stable electrical conductivity even when heated to 300° F.

For instance, a film made by sputtering a 10% tin-90% indiumcathode at 3000 volts, 250 milliamperes in a 3.2% oxygen, 96.8% argon 19 millitorr system and 600° F substrate temperature has a resistance of 90 ohms per square when freshly made. This changes to 85 ohms per square as it is cooled and exposed to air at 300° F.

A film made by sputtering a pure indium cathode at 3000 volts, 215 milliamperes in an oxygen-argon mixture containing 3.2% oxygen at 22 millitorr and 600° F. substrate temperature has a resistance of 14,000 ohms per square when freshly made and the resistance increases to 280,000 ohms per square when it is exposed to air at 300° F.

A film made by sputtering a pure indium cathode at 3000 volts, 235 milliamperes in an oxygen-argon mixture containing 1.6% oxygen at 24 millitorr and 600° F. substrate temperature has a resistance of 80 ohms per square when freshly made but this increases to 150 ohms per square when it is exposed to air at 300° F.

EXAMPLE VI

The following experiments are performed using essentially the same equipment as before at 3000 volts, 2 inches cathode to substrate spacing and 600° F. substrate temperature, a cathode composition of 5.6% tin, 94.4% indium, a current of 180 milliamperes and a pressure of 20 millitorr. Experiments were performed at various oxygen concentrations. Resistivities were measured after 15 minutes of cathode sputtering for each oxygen concentration tested. A first sample developed a film having a resistivity of 280 ohms per square after cathode sputtering under such conditions in a system containing 6.3% oxygen. After cooling in vacuum, the resistivity of the film dropped to 130 ohms per square. Further exposure to air raised the resistivity to 150 ohms per square. A second sample cathode sputtered in a system containing 3.2% oxygen under otherwise identical conditions developed a film having a resistivity of 75 ohms per square. This was reduced to 40 ohms per square by 5 minutes at 700° F. in argon at 0.05 millitorr. A third sample cathode sputtered in a 1% oxygen system developed a film having a resistivity of 23 ohms per square, which became 26 ohms per square after cooling in a vacuum and remained 26 ohms per square after further exposure to air.

EXAMPLE VII

Using a fixed cathode 5 inches square of 5.6% tin and the balance indium spaced 1.4 inches from a 4 inch square sample of polished plate glass in center to center alignment, cathode sputtering for 60 minutes in an atmosphere at 37 millitorr pressure containing 24% hydrogen, 11% oxygen and 65% argon by volume at a voltage of 3500 volts D.C. and 750 milliamperes current for 60 minutes developed a sample temperature of 600° F. A film having an estimated thickness of 6000 Angstroms, a resistivity of 3 to 4 ohms per square and a transmission of about 72% resulted. No attempt was made to control the substrate temperature.

The above experiment involved the use of hydrogen. In view of the danger involved in handling hydrogen, efforts were directed to developing another technique to produce highly transparent, highly electroconductive metal oxide films by cathode sputtering in the absence of hydrogen.

Smaller substrates have more uniform films when so treated and larger substrates less uniform films when so treated. Accordingly, apparatus containing a scanning cathode modified from that disclosed in U.S. Pat. No. 3,414,503 to Brichard and containing heating and cooling elements positioned to control the substrate temperature during a vacuum coating operation was developed to coat substrates having minimum dimensions of about 6 inches on each side. The apparatus is described below.

The resistance of a film after deposition can be changed according to how it is treated. The film after deposition is close to equilibrium with the atmosphere at the temperature involved. If the film is exposed to more oxidizing conditions, it tends to increase in resistance; if it is exposed to more reducing conditions it tends to decrease in resistance. The rate of change is dependent on the film temperature, and with the stability of the film as discussed before.

Thus, it is unwise to allow air to come into contact with the film at temperatures above 300° F. On the other hand, if a lower resistance is desired, the film can beneficially be cooled from its operating temperature in high vacuum (say below $10^{-4}$ torr).

Prior to the present discovery of the benefits of heating the substrate to a controlled temperature above 400° F. during the cathode sputtering operation, the cathode sputtering operation in low pressure atmospheres was difficult to control and it was only occasionally that coated glass samples having adequate optical properties and electroconductive properties were produced. Of about two hundred experiments performed wherein the sputtering was started at whatever substrate temperature existed in the vacuum chamber, the resistances obtained were considerably higher and optical transparencies lower than those obtained with the temperature controlled substrate operation suggested by the present invention, even though the experiments were performed with small articles that, in retrospect, are easier to coat uniformly than larger articles. Furthermore, many experimental samples formed metallic films and those that were electroconductive had resistances that varied by as much as more than 100:1 ratio from one locality to another.

An illustrative example of apparatus suitable for performing the present invention will be described in order to facilitate the ability of one skilled in the art to produce transparent electroconductive articles having superior optical and electroconductive properties, particularly those having dimensions of at least 6 inches.

In the drawings that form part of this description,

DESCRIPTION OF APPARATUS

Figure 1:
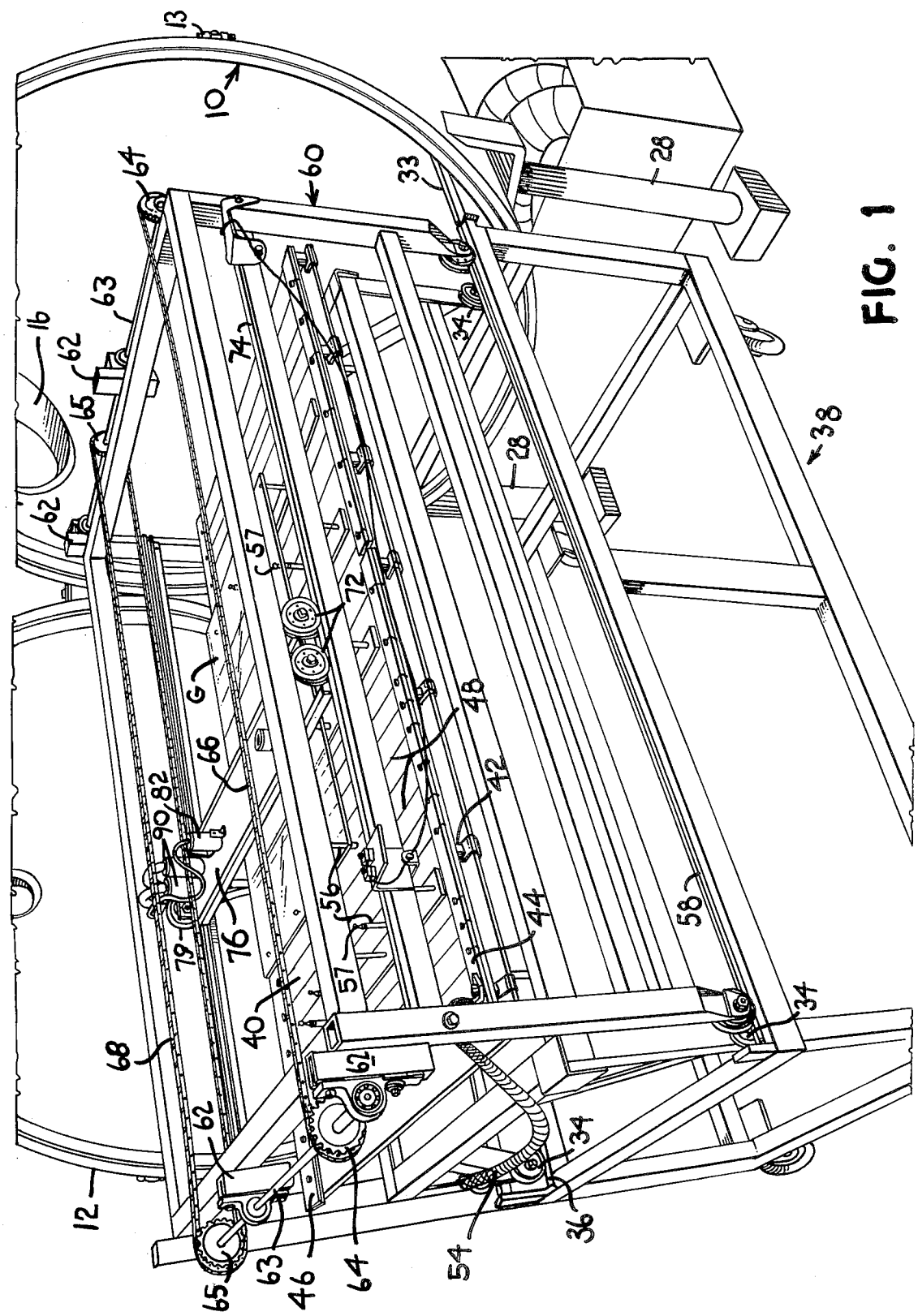
FIG. 1 is a perspective view of apparatus for performing the present invention with substrate and electrode support structure shown outside the vacuum chamber.
Figure 2:
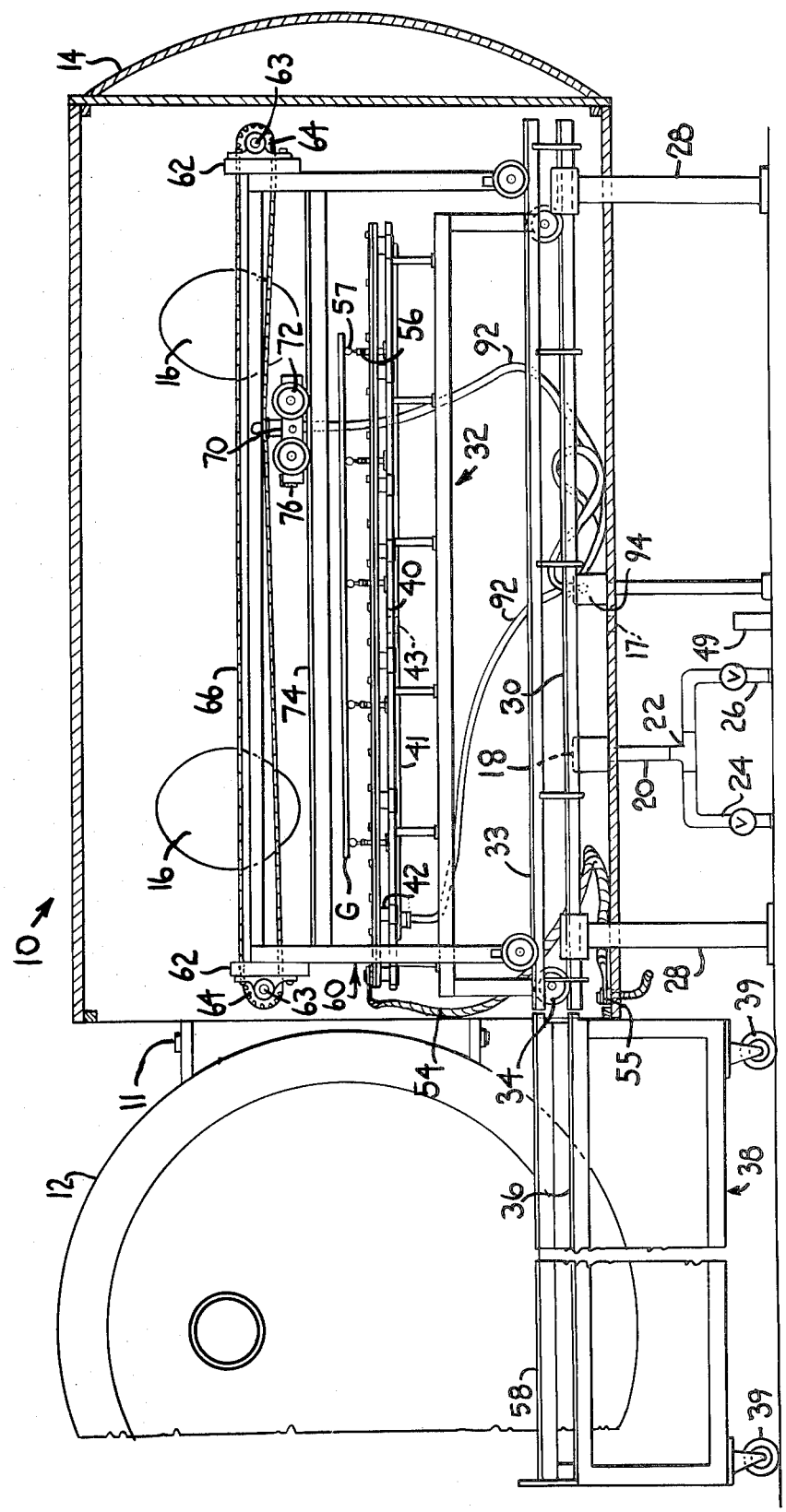
FIG. 2 is a partly schematic side section of the apparatus of FIG. 1, showing the support structure in the vacuum chamber.
Figure 3:
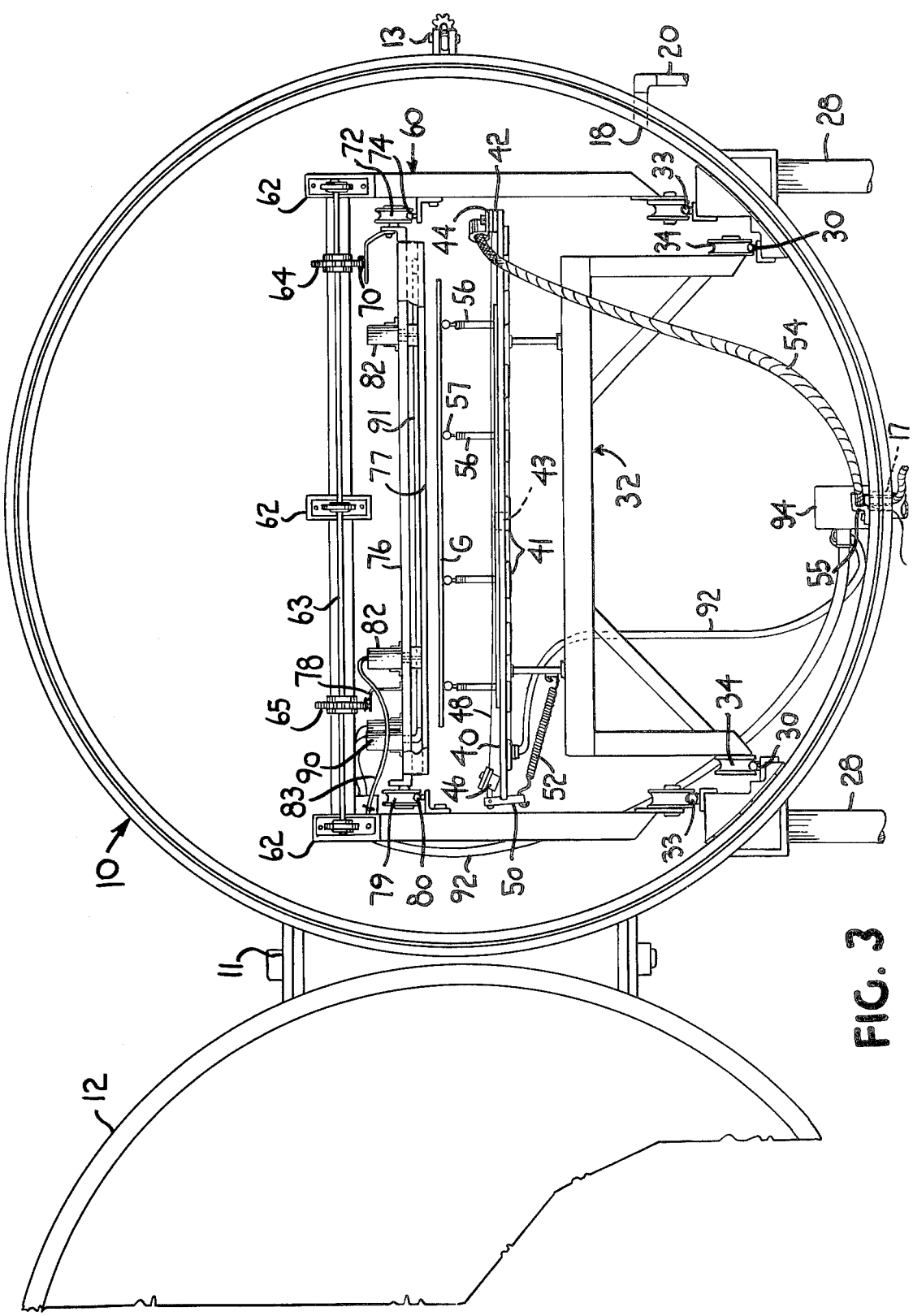
FIG. 3 is a partly schematic end view corresponding to the side view of FIG. 2.

Referring to the drawings, a typical apparatus for cathode sputtering comprises a horizontally disposed chamber 10 arranged in the form of a horizontally oriented cylinder 72 inches long and 66 inches in diameter having hinges 11 on which a door 12 is pivoted open. Clamps 13 (FIG. 3) are provided to lock the door 12.

Another end door 14 is closed at its other end. Exhaust openings 16 are connected to a vacuum manifold (not shown). An additional gas supply opening 18 receives a mixed gas supply line 20. The latter extends from a T connection 22 between gas feed lines 24 and 26 communicating with sources of argon and oxygen (not shown), respectively. The feed lines 24 and 26 are valved to control inward flow of the respective gases at a metered rate of flow for each gas. The chamber 10 is supported in spaced relation above the ground on vertical posts 28.

A lower pair of parallel tracks 30 extend horizontally the length of the cylindrical chamber 10 to receive a heater supporting carriage 32. An upper pair of parallel tracks 33 is also provided for purposes to be described later. The heater supporting carriage 32 has rollers 34 that ride on the tracks 30 from a positive within the cylindrical chamber 10 to a lower set of tracks 36 supported on a loading table 38 disposed outside the chamber 10. The loading table 38 is provided with pivoted casters 39 to facilitate placing the loading table 38 in alignment with the cylindrical chamber 10 both before and after a cathode sputtering operation.

The heater supporting carrier 32 is provided with an anode plate 40 that supports a water cooling system 41 on its lower surface and a series of spacers 42 of electrical insulating material that support a bus bar 44 in spaced, electrically insulated relation to said anode plate on its upper surface. A grounded bus bar 46 extends parallel to bus bar 44. The bus bars 44 and 46 are ½ inch by 2 inch in cross section and 6 feet long and are interconnected at each inch of length by one of a series of parallel heating wires 48.

The wires occupy an area aligned with and extending beyond the edges of the substrate. Pivots 50 are connected at one end to the grounded bus bar 46 and at their other end to a grounded expansion spring 52. The spring loading keeps the heating wires straight and parallel as they become heated during the application of voltage across the bus bars.

An insulated power line 54 connects the bus bar 44 to a source of A.C. voltage (not shown) outside the chamber 10 through an insulated terminal 55. This source is preferably no more than 50 volts and the heating wires are nichrome type 5 wires (17 gauge) and are approximately 3 feet long.

The anode plate supports a series of posts 56 arranged in checkerboard arrangement to support one or more glass sheets during a cathode sputtering operation. The posts 56 are offset with respect to the paths traversed by the parallel heating wires 48 and are of such size that the glass is spaced about 2 inches from the plane occupied by the heating wires 48. A thermal sensing device 49 peers through an aperture in anode plate 40 and is focused on the substrate to record its temperature.

The posts 56 and the anode 40 are both vertically adjustable in any manner well known in the art, such as by adjustment nuts and externally threaded shafts. The posts 56 are provided with rounded or pointed heads 57 to provide minimum areas of contact while supporting the substrate G. The posts may be adjusted vertically to support flat or curved glass. The spacing between adjacent posts may be from 1 to 6 inches depending on the size of substrate treated and the temperature of treatment.

The loading table 38 is provided with an outer and upper pair of tracks 58 that extend horizontally laterally beyond and above the plane occupied by the first set of tracks 36 in position to form extensions of tracks 33 within the vacuum chamber 10. These outer tracks 58 support an upper carriage 60 which comprises a frame larger and higher than the heater supporting carriage 32 and enable one to transfer the upper carriage 60 into and out of the chamber 10.

The upper carriage 60 supports a set of brackets 62 at each longitudinal end thereof. A shaft 63 having sprockets 64 and 65 fixed thereto interconnects the aligned brackets of each set and a chain 66 or 68 is entrained about each pair of sprockets 64 or 65, respectively. One of the shafts 63 is connected to a reversing drive motor (not shown) located outside the chamber 10. Chain 66 is connected to a lug 70 connected to wheels 72 that ride on a rail 74. The lug 70 is connected to one side of a transverse bar member 76. A similar lug 78 is connected to chain 68. The other end of the transverse bar member 76 is connected to wheels 79 that ride on a rail 80 parallel to rail 74. Actuation of the reversing drive motor causes the transverse bar member 76 to reciprocate transverse to its length.

The transverse bar member 76 is attached in insulated relation to a cathode 77. The latter has a coating of metal (for example 5% tin and the rest indium) on its bottom surface. A cathode connection 82 is connected to the transverse cathode 77. A flexible insulated wire 83 interconnects the cathode connection 82 to a coupling (not shown) adapted for connection to the cathode of a high D.C. voltage power source (not shown) to supply power for sputtering located outside the chamber 10. A pair of water connectors 90 are connected to cooling pipes 91 supported between the bar member 76 and the cathode 77 to cool the latter when necessary. Flexible water lines 92 of electrically insulated material, such as plastic, interconnect the connectors 90 to a water source through a feed through 94 carried at the bottom of the chamber 10. Other suitable water and electrical connectors are mounted in the wall of the chamber 10 in a similar manner. For example, another flexible water line 92 feeds water to the water cooling system 41 for the anode 40.

When the reversing drive motor is actuated, the cathode 77 scans the glass substrate G supported at the top of the checkerboard array of posts 56.

The carriages 32 and 60 are removable from the chamber 10 for loading and unloading glass sheets (including framing sheets that abut the edges of the substrate to avoid edge effects) and for any maintenance needed. The electrical connectors are very carefully insulated and are sufficiently long to allow for movement of the cathode 77 and the carriages 32 and 60. The connectors can be attached to exterior water sources at various additional feed throughs. Suitable packing seals are provided to maintain a good seal for the chamber 10 at each feed through. These connectors and seals are available commercially and form no part of the present invention.

While each particular operation and each particular apparatus has different minimum oxygen partial pressures required to produce a clear film at each substrate temperature, the following parameters were established for a glass sheet 2 feet by 3 feet. The parameters include an atmosphere of 20 millitorr, a cathode to substrate spacing of 2 inches, 3000 volts D.C., a cathode 6 inches wide and 40 inches long, a scanning path 36 inches long over the sample, a 2 inch frame of glass surrounding the sample and reciprocating the cathode in a direction transverse to its length at a speed to provide a complete cycle in 20 seconds. The following minimum partial pressures of oxygen are estimated at the following substrate temperatures to produce a clear, metal oxide film of low resistance: 20% or 4 millitorr at 300° F., 9% or 2 millitorr at 400° F., 5% or 1 millitorr at 500° F., 4% at 600° F., and 3% at 700° F. (or below 1 millitorr at above 500° F.)

In a typical operation using an initial oxygen partial pressure of about 10% when the substrate temperature is 400° F. at the onset of the cathode sputtering, and reducing the rate of oxygen flow as the substrate temperature increases while maintaining the argon flow constant and while evacuating with a vacuum pump rated at 1300 cu. ft. per minute produces a film having a resistance of 2 ohms per square and 76% total luminous transmission coefficient as measured by a Gardner Hazemeter after 1 hour of such treatment. Such high transmission and high conductivity combination is not possible with prior art techniques.

EXAMPLE VIII

Ten samples of ⅛ inch thick twin ground plate glass were cathode sputter using the illustrated apparatus at a 1.5 inches cathode to substrate spacing with a cathode 6 inches wide and 40 inches long having a sputtering surface composed of 10% tin and 90% indium, for 75 minutes at a D.C. voltage of 3200 volts with heating wires initially energized at 24 volts (350 amperes) for 10 minutes, followed by 5 minutes at 20 volts (250 amperes) followed by 12 volts (150 amperes) for 2 minutes, then no voltage for the remainder of the cathode sputtering. The cathode was reciprocated at an average linear speed of about 18 feet per minute and the atmosphere of the coating chamber was 4.46% oxygen and the balance argon maintained at a pressure of about 30 millitorr. The chamber was evacuated after 75 minutes of sputtering and the coated substrates were cooled to about 250° F. in the evacuated atmosphere before their removal. The coated samples had a transmission coefficient of 76% though a thickness of about 7000 Angstroms and a resistivity of 2 ohms per square.

The term ohms per square has been used hereinabove to describe the conductivity of the film formed by the novel process of this invention. Although specific resistivity is usually utilized to describe or compare the conductivity of materials, it is inappropriate for describing the conductivity of very thin films because of the difficulty of measuring the thickness of the film.

Specific resistance is the resistance between opposite faces of a cubic centimeter of material and is expressed by the equation $\rho = (R \times A/l)$, where $\rho$ is the specific resistance, $R$ is the resistance of the conductor, $A$ is the cross-sectional area of the conductor, and $L$ is the length of the conductor. For a thin film, this expression becomes $\rho = (R \times W \times t/l)$ wherein $W$ and $L$ are the surface dimensions and $t$ is the film thickness. For a square area of surface, $W$ and $L$ are equal and $\rho = R \times t$ or $R$ (resistance for a square area of surface) $= \rho/t$. Thus, the conductivities of various types of films having approximately equivalent thickness may be directly compared by comparing resistance per square.

While the examples enumerated above concentrate on cathodes having indium coatings and indium-tin alloys as coatings, it is understood that other metals and alloys from the group of elements of atomic numbers 48 to 51 may be used, for example, tin cathodes containing up to 15% antimony produce films having better than 70% luminous transmittance and about 100 ohms per square and cadmium cathodes containing up to 20% indium produce films having better than 60% luminous transmittance and about 1000 ohms per square in resistivity.

The samples produced by cathode sputtering in an atmosphere in which the heating elements provided a controlled uniform temperature pattern throughout the area of the substrate had electrical conductivities that did not vary by more than 20% from the most conductive to the least conductive areas. Very rarely are films produced that lack the requisite transparency (over 70%) and electroconductive properties including uniformity of electroconductivity as well as low electrical resistivity (below 10 ohms per square) for substrates having at least 6 inch lengths and 6 inch widths. By comparison, earlier efforts to coat glass substrates without uniform heating thereof by heating means independent of the heat induced by sputtering resulted in coatings whose electroconductivities varied by a factor as high as 10 to 1 from portion to portion of the coated substrate even when scanning the cathode.

Another obvious improvement brought about by the present invention is seen from comparisons of electroconductive and optical properties of films produced by cathode sputtering with those produced by spraying a metal salt composition on a substrate heated to pyrolizing temperature. For example, an article having 10 ohms resistance between oppositely disposed bus bars for an indium oxide coating has a transmission coefficient of only 68% when produced by spraying and 85% for the same composition produced by cathode sputtering using the temperature control criteria described above. In addition, articles with cathode sputtered films hve significantly less distortion than those produced by heating to a temperature sufficient for pyrolysis followed by spraying.

The apparatus aspect of the present invention makes it possible to irradiate the substrate simultaneously with the cathode sputtering operation. This hitherto unobtained result is made possible by limiting the voltage applied to the spaced heating elements in the form of the resistance wires 48 to a maximum of 50 volts. This voltage, particularly it if is a A.C. voltage, is insufficient to cause arcing between the heating wires and grounded elements within the chamber. The heating elements are spaced from or insulated from grounded elements.

Irradiating with heat produced by electrically energized heating wires enables the present apparatus to uniformly heat substrates that do not have optically flat surfaces. Prior art temperature controllers for the substrate which supported the substrate by contact were limited for efficient use with substrates having optically flat surfaces.

While the description of working embodiments has been provided for illustrative purposes, it is understood that variations thereof may be made without departing from the spirit of the invention as defined in the claimed subject matter that follow.

We claim:

1. A method of applying a uniform, transparent electroconductive coating having an electrical resistance of less than about 10 ohms/square and a visible light transmittance of at least about 70 percent consisting essentially of the oxide of a metal taken from the class of metals having an atomic number between 48 and 51 and mixtures of said oxides on a ceramic substrate comprising, supporting said ceramic substrate in a low pressure atmosphere not exceeding $10^{-1}$ torr and containing a mixture of oxygen and inert gas having an oxygen concentration of at least 1 percent while performing the steps of:

heating said substrate by applying heat throughout the area of said substrate from a radiant heat source spaced from and facing said substrate to heat said substrate to a temperature within the range of from 400° F. to a temperature at which the substrate becomes distorted, cathode sputtering said oxide of metal onto said substrate when its temperature reaches at least 400° F., continuing to apply heat to said substrate to maintain its temperature at a preselected temperature within said temperature range while continuing said cathode sputtering until a film of desired thickness is formed, and discontinuing said cathode sputtering when said film develops a desired electroconductivity.

2. A method as in claim 1, wherein said metal oxide is a mixture of tin oxide and indium oxide.

3. A method as in claim 2, wherein said mixture consists essentially of 80 - 99% by weight of indium and of 1 to 20% by weight of tin.

4. The method as in claim 1 wherein said heat application to maintain temperature is provided by applying additional heat from a second radiant heat source at a substantially uniform rate throughout the area of said substrate.

5. A method as in claim 1, wherein said partial oxygen pressure in said low pressure atmosphere is higher than the minimum partial pressure necessary to obtain a clear, transparent film at the beginning of said cathode sputtering at the lower temperature of said range and is reduced as the temperature of said substrate increases during said cathode sputtering.

6. A method as in claim 1, wherein said heated substrate is sputtered from a reciprocating cathode moving in a path facing said substrate surface to be coated.

7. A method as in claim 1, wherein said heated substrate is surrounded by a frame to reduce edge effects.

8. A method of cathode sputtering a clear, transparent electroconductive film of an oxide of a metal having an atomic number between 48 and 51 and containing tin and indium atoms onto a glass substrate whereby the sputtered film has an electrical resistance less than about 10 ohms/square and the film has a visible light transmittance of at least about 70 percent comprising exposing said substrate to a low pressure oxygen-argon atmosphere below $10^{-1}$ torr, heating said substrate to a substantially uniform temperature from an independent radiant heat source, beginning to cathode sputter said substrate when its temperature reaches a temperature of a least about 400° F. and said partial pressure of oxygen is at least 2 millitorr, continuing to provide heat to said substrate to maintain said substrate at a temperature between about 400° F. and the temperature at which it becomes distorted, and reducing the partial pressure of oxygen in said atmosphere as the temperature of said substrate is increased while continuing said cathode sputtering and maintaining a sufficient oxygen concentration to maintain a clear coating until a clear, transparent coating having a visible light transmittance of at least 70% and having a resistivity of less than 10 ohms per square results, and discontinuing said cathode sputtering and cooling said substrate in said low pressure atmosphere to a temperature below the temperature at which said cathode sputtering began before removing said coated substrate from said low pressure atmosphere.

9. A method as in claim 8, comprising supporting said substrate in a substantially horizontal plane, irradiating said substrate from below and cathode sputtering said substrate from above.

10. A method as in claim 9, wherein said substrate is at least 6 inches long and at least 6 inches wide, further including the step of reciprocating said cathode in a plane above said substrate with said sputtering surface in facing relation to the upper surface of said substrate to enable the cathode to scan said upper surface during said cathode sputtering operation.

11. A method as in claim 8, further including monitoring the surface resistivity of the film formed and discontinuing said cathode sputtering when the surface resistivity of the film becomes less than 10 ohms per square.

* * * * *